United States Patent
Wang et al.

(10) Patent No.: US 9,431,966 B2
(45) Date of Patent: *Aug. 30, 2016

(54) HIGH EFFICIENCY AND HIGH LINEARITY ADAPTIVE POWER AMPLIFIER FOR SIGNALS WITH HIGH PAPR

(71) Applicant: Aviacomm Inc., Sunnyvale, CA (US)

(72) Inventors: Hans Wang, Mountain View, CA (US); Tao Li, Campbell, CA (US); Binglei Zhang, San Jose, CA (US); Shih Hsiung Mo, San Jose, CA (US)

(73) Assignee: AVIACOMM INC., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/864,598

(22) Filed: Sep. 24, 2015

(65) Prior Publication Data

US 2016/0013757 A1 Jan. 14, 2016

Related U.S. Application Data

(63) Continuation of application No. 13/619,988, filed on Sep. 14, 2012, now Pat. No. 9,160,277.

(51) Int. Cl.
| | |
|---|---|
| *H03F 1/02* | (2006.01) |
| *H03F 3/195* | (2006.01) |
| *H03F 3/24* | (2006.01) |
| *H03F 3/19* | (2006.01) |
| *H03F 3/21* | (2006.01) |

(52) U.S. Cl.
CPC ............ *H03F 1/0205* (2013.01); *H03F 1/0222* (2013.01); *H03F 3/19* (2013.01); *H03F 3/195* (2013.01); *H03F 3/211* (2013.01); *H03F 3/245* (2013.01); *H03F 2200/336* (2013.01); *H03F 2200/408* (2013.01); *H03F 2200/435* (2013.01); *H03F 2200/451* (2013.01); *H03F 2203/21142* (2013.01)

(58) Field of Classification Search
CPC ............... H04B 2001/0408; H04B 2001/0416; H04B 2001/045; H03F 3/20; H03F 3/24
USPC ................ 455/115.3, 127.1–127.5, 129, 574; 330/278
See application file for complete search history.

(56) References Cited

U.S. PATENT DOCUMENTS

| | | | | |
|---|---|---|---|---|
| 9,160,277 | B2 * | 10/2015 | Wang | H03F 1/0222 |
| 2002/0180522 | A1 * | 12/2002 | Duperray | H03F 1/0261 330/136 |
| 2006/0238244 | A1 * | 10/2006 | Grundlingh | H03F 1/0211 330/136 |
| 2007/0010218 | A1 * | 1/2007 | Monroe | H03F 1/0244 455/127.1 |
| 2009/0202017 | A1 * | 8/2009 | Ichihara | H03G 3/004 375/297 |
| 2010/0208638 | A1 * | 8/2010 | Kawaji | H03F 1/0277 370/311 |

* cited by examiner

*Primary Examiner* — Nguyen Vo
(74) *Attorney, Agent, or Firm* — Shun Yao; Park, Vaughan, Fleming & Dowler LLP

(57) ABSTRACT

One embodiment of the present invention provides a system for controlling operations of a power amplifier in a wireless transmitter. During operation, the system receives a baseband signal to be transmitted, and dynamically switches an operation mode of the power amplifier between a high power back-off mode having a first power back-off factor and a normal mode having a second power back-off factor based on a level of the baseband signal.

19 Claims, 4 Drawing Sheets

HIGH EFFICIENCY AND HIGH LINEARITY ADAPTIVE POWER AMPLIFIER FOR SIGNALS WITH HIGH PAPR

RELATED APPLICATION

This application is a continuation of U.S. application Ser. No. 13/619,988, entitled "HIGH EFFICIENCY AND HIGH LINEARITY ADAPTIVE POWER AMPLIFIER FOR SIGNALS WITH HIGH PAPR," by inventors Hans Wang, Tao Li, Binglei Zhang, and Shih Hsiung Mo, filed 14 Sep. 2012.

BACKGROUND

1. Field

The present disclosure relates generally to a power amplifier used in orthogonal frequency-division multiplexing (OFDM) transmitters. More specifically, the present disclosure relates to an adaptive power amplifier that is capable of achieving high efficiency when amplifying OFDM signals.

2. Related Art

Orthogonal frequency-division multiplexing (OFDM) technology has become more and more popular in recent years because of its many advantages, including frequency efficiency and robustness against frequency-selective channel fading in the tough wireless environment. During the past decade, OFDM has become the basis of many standards, such as WiFi, Worldwide Interoperability for Microwave Access (WiMAX), Digital Video Broadcasting (DVB), Long Term Evolution (LTE), TV White Space (TVWS), etc.

However, OFDM also suffers from some drawbacks. One important problem is the high peak-to-average power ratio (PAPR) of the transmitted signal. The high peak can result in saturation of the power amplifiers, leading to non-linear signal distortion. To prevent the non-linear distortion, conventional approaches rely on keeping the power amplifier working in the linear range by backing-off the output power of the amplifier entirely to accommodate the high peaks. Such approaches can result in either a low signal-to-noise ratio (SNR) or an oversized and inefficient power amplifier.

SUMMARY

One embodiment of the present invention provides a system for controlling operations of a power amplifier in a wireless transmitter. During operation, the system receives a baseband signal to be transmitted, and dynamically switches an operation mode of the power amplifier between a high power back-off mode having a first power back-off factor and a normal mode having a second power back-off factor based on a level of the baseband signal.

In a variation on this embodiment, the system converts the baseband signal from a digital domain to an analog domain; modulates the DA-converted baseband signal; and amplifies, by the power amplifier, the modulated signal.

In a variation on this embodiment, while dynamically switching the operation mode of the power amplifier, the system determines whether the level of the baseband signal exceeds a predetermined threshold. If so, the system places the power amplifier in the high power back-off mode; if not, the system places the power amplifier in the normal mode.

In a further variation, placing the power amplifier in the high power back-off mode involves increasing a bias voltage or a bias current of the power amplifier.

In a variation on this embodiment, a difference between the first power back-off factor and the second power back-off factor is determined by a peak-to-average power ratio (PAPR) of the baseband signal.

In a variation on this embodiment, the baseband signal is received from a baseband digital signal processor (DSP) for the wireless transmitter.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

Embodiments of the present invention provide an OFDM transmitter that can adaptively adjust the operating point of the power amplifier based on the level of the signal. More specifically, when the level of the baseband signal is high, the bias voltage of the power amplifier is increased to ensure that the high-level signal is not distorted. Once the signal level returns to a normal range, the power amplifier returns to its normal working mode, thus providing higher power efficiency overall. Because the decision is made based on the baseband signal, the transition time between the two operating modes of the power amplifier can be sufficiently slow.

Power Amplifier for OFDM Transmitter

In OFDM systems, the high PAPR value is a result of the superposition of many independent subcarriers, and is directly proportional to the number of subcarriers. More specifically, the PAPR of an OFDM system can be given by: PAPR(dB)=10log(N), where N is the number of subcarriers. For example, the OFDM-based standard 802.11 a/g specifies the number of OFDM subcarriers as 52. When the phases of all 52 subcarriers are lined up during a symbol period, the PAPR is 17 dB. To accommodate such a high peak while maintaining linearity, that is to provide gain without compression at every possible peak, the operating point of the power amplifier needs to back-off 17 dB from the peak-power handling point. Such a large power back-off factor means that the power amplifier has to be oversized in terms of its average power requirements. In addition, it can only provide a significantly reduced output power (by an amount given by the PAPR) when the signal level is lower than the peak. Note that, because most of the time the signal level is lower than the peak, and because the DC power consumption is determined by the peak level, the overall efficiency of the power amplifier (PA) is very low. For example, the maximum power efficiency of a typical Class B PA can be 78.5%. However, if the signal being amplified has a PAPR value of 10 dB, this efficiency drops to 7.85%, which means that an output power level of 100 mW will consume 1.3 W of DC power. Such a high DC power consumption can be a huge problem for battery-powered portable devices (such as laptops or tablets) and mobile devices (such as smartphones).

Figure 1:
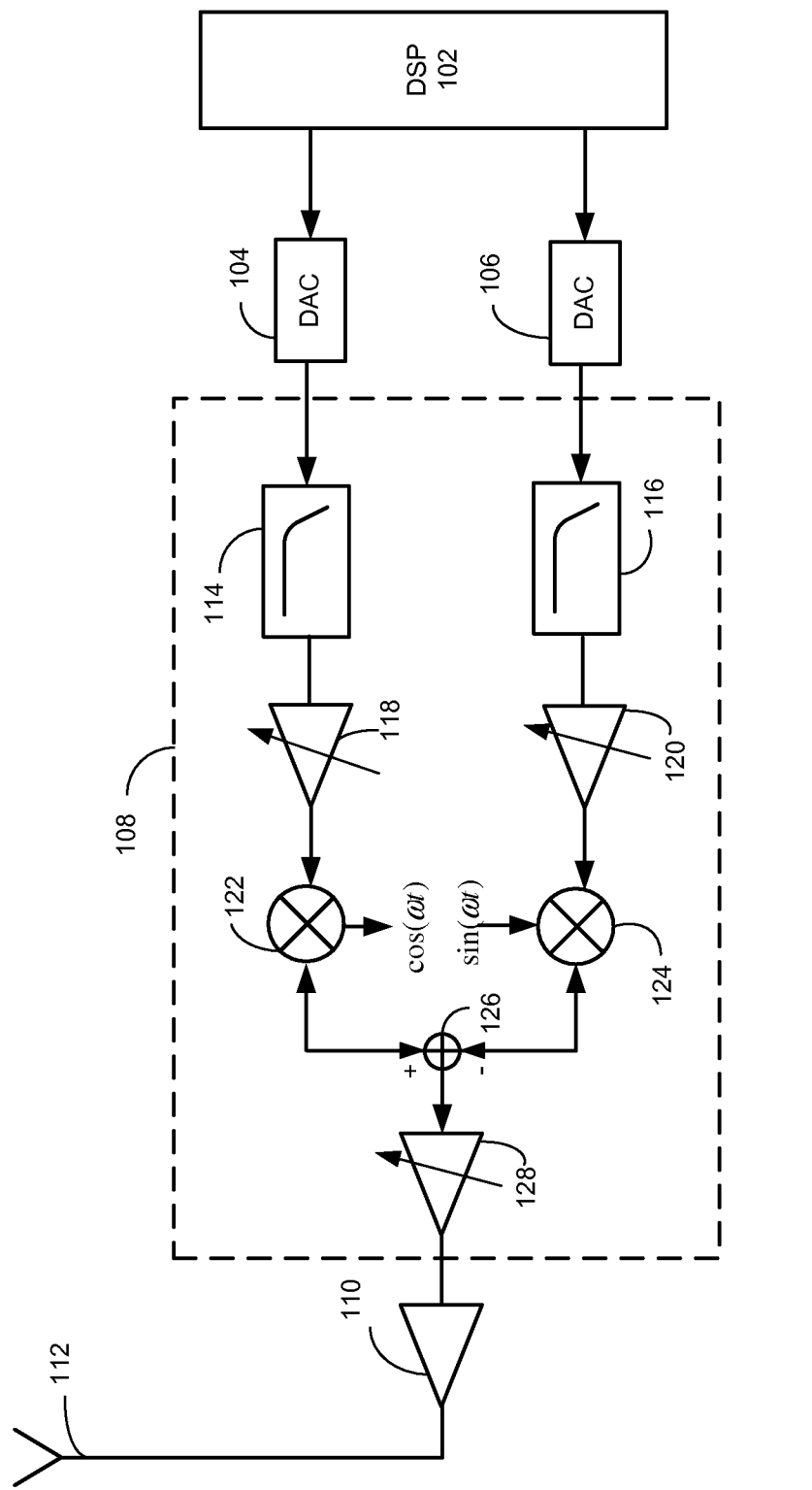
FIG. 1 presents a diagram illustrating the architecture of a conventional wireless transmitter.

FIG. 1 presents a diagram illustrating the architecture of a conventional wireless transmitter. In FIG. 1, transmitter 100 includes a baseband digital signal processor (DSP) 102, digital-to-analog converters (DACs) 104 and 106, a radio frequency integrated circuit (RFIC) chip 108, a power amplifier 110, and an antenna 112. RFIC chip 108 includes LPFs 114 and 116, variable gain amplifiers (VGAs) 118 and 120, mixers 122 and 124, an adder 126, and a power-amplifier driver 128.

During operation, baseband DSP 102 outputs I and Q channel baseband digital signals to DACs 104 and 106, respectively, which convert the digital signals to the analog domain. The converted analog signals are then filtered and amplified by LPFs 114 and 116 and VGAs 118 and 120, respectively. The amplified I and Q baseband signals are then modulated by a modulator, which includes mixers 122-124 and adder 126. Note that other standard components of the modulator, such as the local oscillator and the phase shifter, are not shown in FIG. 1. The modulated signal is then sent to power amplifier 110 via power-amplifier driver 128. After amplification by PA 110, the modulated signal is transmitted via antenna 112.

As previously discussed, when designing power amplifier 110, it is very difficult to simultaneously meet the linearity and power efficiency requirements, especially for OFDM signals having high PAPR. Satisfying the linearity requirement often means sacrificing power efficiency, and vice versa. To resolve such a conflict, in embodiments of the present invention, the operating point of the transmitter PA is adjusted dynamically according to the level of the baseband signal, thus meeting the linearity requirement while achieving an overall high efficiency. More specifically, in embodiments of the present invention, the PA is configured to work at a high power back-off mode only when the system determines that the baseband signal exceeds a threshold; otherwise, the PA is configured to work at a normal mode, which does not require power back-off.

Figure 2:
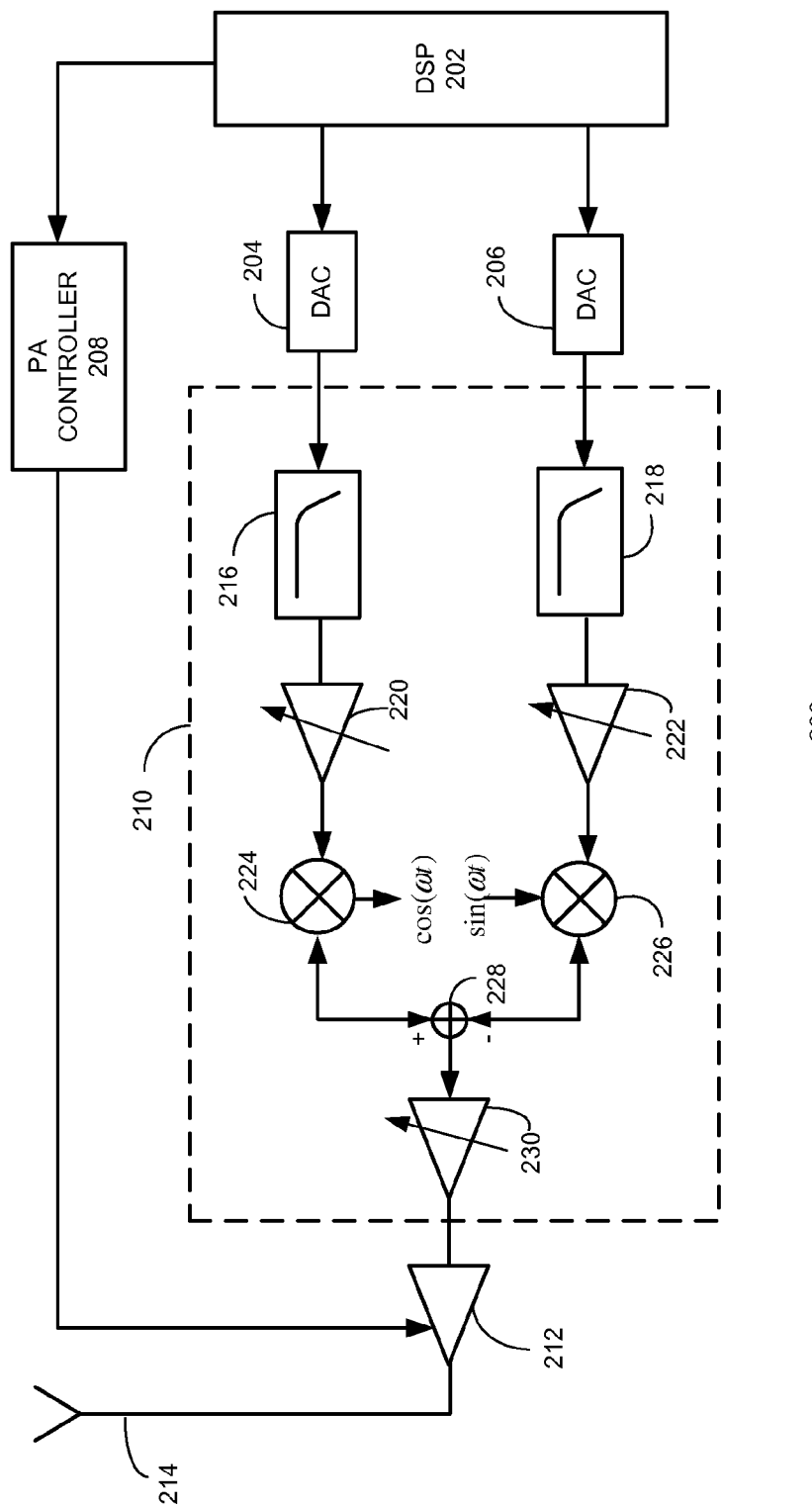
FIG. 2 presents a diagram illustrating the architecture of a wireless transmitter, in accordance with an embodiment of the present invention.

FIG. 2 presents a diagram illustrating the architecture of a wireless transmitter, in accordance with an embodiment of the present invention. In FIG. 2, transmitter 200 includes a baseband digital signal processor (DSP) 202, digital-to-analog converters (DACs) 204 and 206, a power amplifier controller 208, an radio frequency integrated circuit (RFIC) chip 210, a power amplifier 212, and an antenna 214. RFIC chip 210 includes LPFs 216 and 218, variable gain amplifiers (VGAs) 220 and 222, mixers 224 and 226, an adder 228, and a power-amplifier driver 230.

During operation, baseband DSP 202, DACs 204 and 206, RFIC chip 210, PA 212, and antenna 214 perform various functions that are similar to the ones in the conventional transmitter shown in FIG. 1, including generating I and Q baseband signals, DA-converting the I/Q signals, filtering, modulating, amplifying, and transmitting the modulated radio signals. In addition, baseband DSP 202 also interacts with PA controller 208, which controls the operation of PA 212 based on the level of the baseband signals.

More specifically, when PA controller 208 detects that the level of the baseband signal is high (such as exceeding a threshold value), it will move the operating point of PA 212 to a point that results in PA 212 working in a high power back-off mode. In one embodiment, PA controller 208 adjusts the bias voltage of PA 212 to a higher level in order to have PA 212 working in the high power back-off mode. When the level of the baseband signal returns to normal, PA controller 208 will then move the operating point of PA 212 to its normal operating point. As discussed earlier, PA 212 suffers from lower efficiency while working in the high power back-off mode, because higher bias voltage means higher DC power consumption. However, because for an OFDM system the possibility of the signal level being much larger than average is relatively low, and most of the time the signal level remains closed to or lower than the average level, PA 212 only needs to work in this high power back-off, thus low efficiency, mode for a small percentage of time. Therefore, the overall efficiency can still remain high.

For example, in a typical OFDM system, 95% of the time the level of the signal remains closed to or lower than an average level with PAPR much lower than 10 dB, whereas only during the remaining 5% of the time does the PAPR of the signal exceed 10 dB. Consequently, the PA is placed in a normal working mode 95% of the time and in the high power back-off mode with at least 10 dB power back-off factor 5% of the time. For a typical Class B PA, this means that the efficiency of the PA remains at the 78.5% level 95% of the time and only drops to about 7.85% for 5% of the time. As a result, the overall efficiency is averaged at around 75%, which is more than eight times the 7.85% efficiency of a conventional PA.

Figure 3:
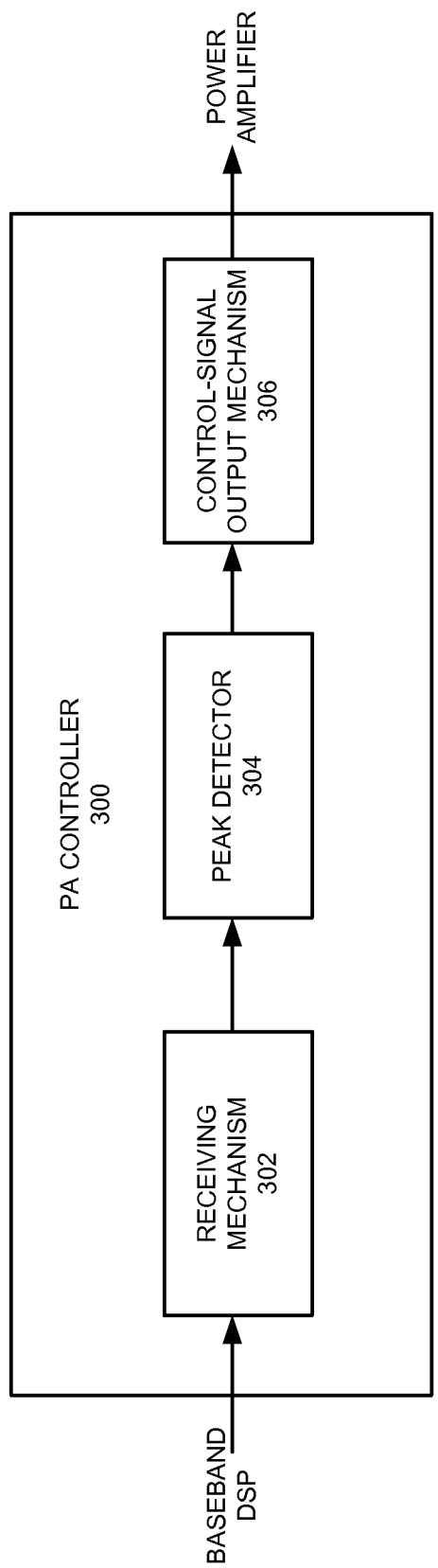
FIG. 3 presents a diagram illustrating the architecture of an exemplary power amplifier controller, in accordance with an embodiment of the present invention.

FIG. 3 presents a diagram illustrating the architecture of an exemplary PA controller, in accordance with an embodiment of the present invention. In FIG. 3, PA controller 300 includes a receiving mechanism 302, a peak detector 304, and a control-signal output mechanism 306.

Receiving mechanism 302 is responsible for receiving information associated with the level of the baseband signals from the baseband DSP, which is the one responsible for generating the baseband signals. If the modulation scheme is quadrature modulation, the overall signal level is determined by both the I channel signal and the Q channel signal. More specifically, the amplitude of the overall signal can be given as: $A=\sqrt{I^2+Q^2}$, where A is the amplitude of the overall signal, I is the amplitude of the I channel signal, and Q is the amplitude of the Q channel signal. Note that the I and Q signals remain in the digital domain in the baseband DSP, hence the overall signal level is also calculated in the digital domain.

Peak detector 304 detects the existence of signal peaks that may result in the PA being placed in high power back-off mode. In one embodiment, peak detector 304 determines whether the overall signal level exceeds a predetermined threshold. If so, peak detector 304 instructs control-signal output mechanism 306 to output a control signal that places the PA in the high power back-off mode. In one embodiment, control-signal output mechanism 306 outputs a control signal configured to increase the bias voltage of the PA in response to the detection of a signal peak. In a further embodiment, the bias voltage is increased to a predetermined higher value. While operating in the high power back-off mode, the amplifier has a relatively large power back-off factor, which means the operating point of the amplifier is backed-off from the point that can produce the maximum average output power without distortion, or the 1 dB compression point (P1 dB). The power back-off factor is usually determined based on the PAPR value of the signal to be amplified. For example, if the PAPR of the signal is 10 dB, then the power back-off factor needs to be at least 10 dB. Note that the PAPR of the signal can be predetermined based on the currently active standard, or can be extracted from the baseband signal.

Peak detector 304 continues to monitor the level of the baseband signal and determines whether the overall signal level has returned to normal. In one embodiment, peak detector 304 determines whether the overall signal level is less than the predetermined threshold. If so, peak detector 304 instructs control-signal output mechanism 306 to output a control signal that places the PA in the normal mode. In one embodiment, control-signal output mechanism 306 outputs a control signal configured to decrease the bias voltage of the PA in response to peak detector 304 detecting the signal level returning to normal. In a further embodiment, the bias voltage is decreased to a predetermined lower value. When operating in the normal mode, the amplifier has a relatively small power back-off factor, which can be closed or equal to 0 dB, that is no power back-off is needed in the normal mode.

Control-signal output mechanism 308 is responsible for outputting appropriate control signals to adjust the operating point of the PA. Note that different types of control signals may be needed for different types of amplifiers. For example, some amplifiers may require adjusting bias voltage, whereas some amplifiers may require adjusting bias current.

Figure 4:
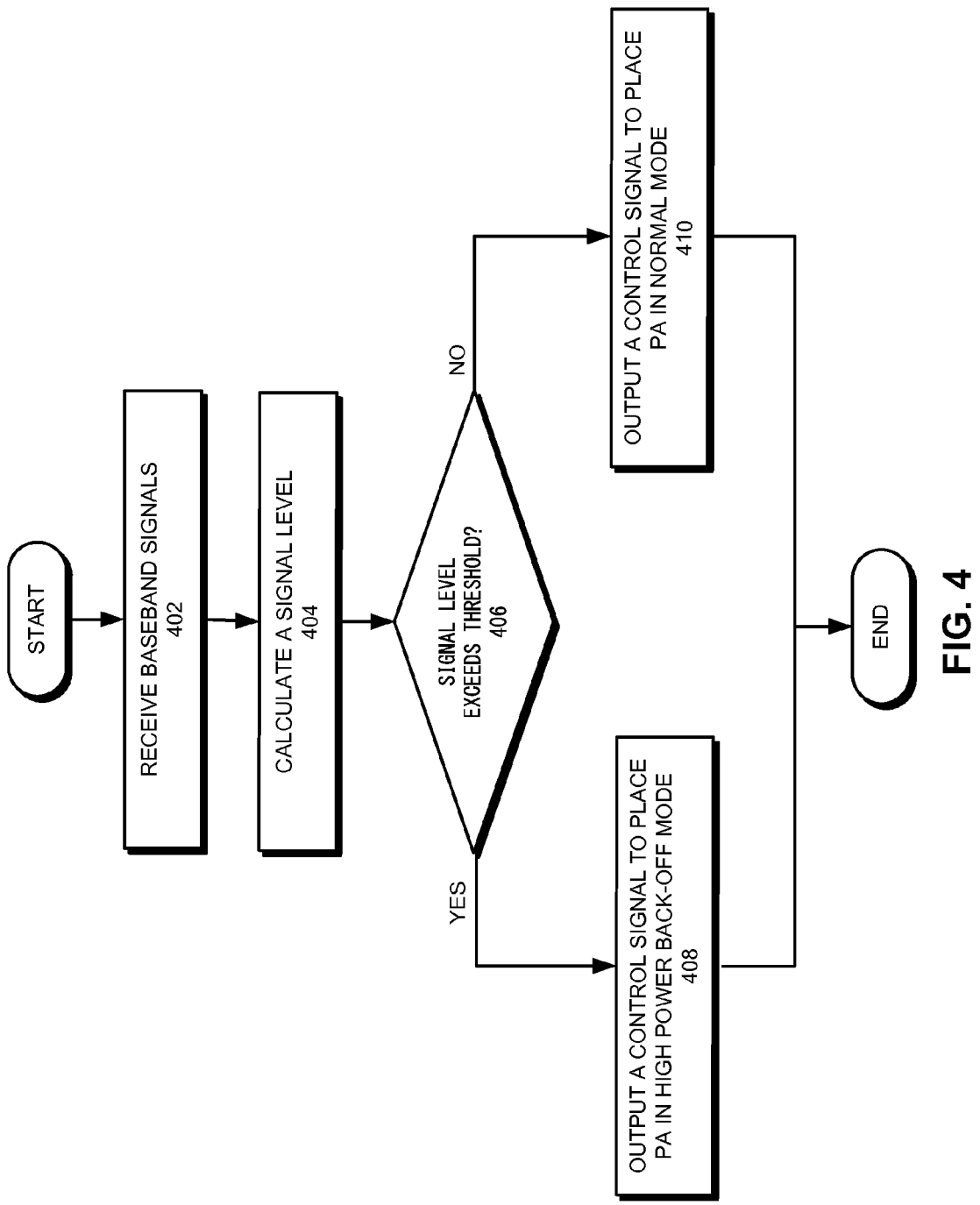
FIG. 4 presents a flowchart illustrating the process of controlling operations of a power amplifier, in accordance with an embodiment of the present invention.

FIG. 4 presents a flowchart illustrating the process of controlling operations of a power amplifier, in accordance with an embodiment of the present invention. During operation, the system receives baseband signals from the baseband DSP (operation 402), and calculates an overall signal level (operation 404). The signal level can be expressed in terms of signal intensity or amplitude. Subsequently, the system determines whether the signal level exceeds a predetermined threshold (operation 406). If so, the system outputs a control signal to the PA to place the PA in a high power back-off mode (operation 408). Otherwise, the system outputs a control signal to the PA to place the PA in a normal mode (operation 410). Note that the control signals can be configured to adjust the bias voltage or current of the PA.

Note that the architectures shown in FIGS. 2 and 3, and the process shown in FIG. 4 are merely exemplary and should not limit the scope of this disclosure. For example, in FIG. 2, the transmitter implements a quadrature modulation scheme. In general, any type of modulation scheme is also possible. In addition, in FIG. 2, the PA controller is a standalone unit. In general, the PA controller can either be a standalone unit or a part of the baseband DSP. For example, the PA controller can be implemented as a function block in the baseband DSP. Moreover, FIG. 4 shows the amplifier being switched between two operation modes, the high power back-off mode and the normal mode. In general, it is also possible to fine-tune the operation point of the amplifier so that the amplifier switches among more than two operation modes. For example, it is also possible to include a medium power back-off mode, and when the signal level is in a medium range, the system places the amplifier in the medium power back-off mode.

Also note that, in embodiments of the present invention, the system adaptively switches the operating mode of the PA based on the signal level of the baseband signal, which is transmitted at a data rate much lower than the carrier frequency. As a result, the control circuit does not need to be a high-speed circuit; therefore, the proposed solution is readily to be implemented using various existing circuitry technologies. It is also optional to introduce a delay circuit in the PA controller to compensate for the time delay caused by DA-converting and modulating of the baseband signal.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit this disclosure. Accordingly, many modifications and variations will be apparent to practitioners skilled in the art. The scope of the present invention is defined by the appended claims.

What is claimed is:

1. A method for controlling operations of a power amplifier in a wireless transmitter, comprising:
   receiving a digital baseband signal;
   in response to determining that a power level of the received digital baseband signal transitions from being equal to or less than a predetermined threshold to being greater than the predetermined threshold, placing the power amplifier in a high power back-off mode having a first power back-off factor; and
   in response to determining that the power level of the received digital baseband signal transitions from being greater than the predetermined threshold to being equal to or less than the predetermined threshold, placing the power amplifier in a normal mode having a second power back-off factor, wherein the second power back-off factor is less than the first power back-off factor.

2. The method of claim 1, further comprising:
   converting the digital baseband signal to an analog baseband signal;
   modulating the analog baseband signal; and
   amplifying, by the power amplifier, the modulated signal.

3. The method of claim 1, wherein placing the power amplifier in the high power back-off mode involves increasing a bias voltage or a bias current of the power amplifier.

4. The method of claim 1, wherein a difference between the first power back-off factor and the second power back-off factor is determined by a peak-to-average power ratio (PAPR) of the digital baseband signal.

5. The method of claim 1, wherein the digital baseband signal is received from a baseband digital signal processor (DSP) for the wireless transmitter.

6. The method of claim 1, wherein the digital baseband signal includes an inphase (I) component and a quadrature (Q) component, and wherein the power level is determined based on both the I component and the Q component.

7. A power amplifier controller for controlling operations of a power amplifier in a wireless transmitter, comprising:
   a receiving mechanism configured to receive a digital baseband signal;
   a power-determination mechanism configured to determine a power level of the received digital baseband signal; and
   a control-signal output mechanism configured to:
      in response to the power level transitioning from being equal to or less than a predetermined threshold to being greater than the predetermined threshold, output a control signal to the power amplifier to place the power amplifier in a high power back-off mode having a first power back-off factor; and in response to the power level transitioning from being greater than the predetermined threshold to being equal to or less than the predetermined threshold, output a control signal to the power amplifier to place the power amplifier in a normal mode having a second power back-off factor, wherein the second power back-off factor is less than the first power back-off factor.

8. The power amplifier controller of claim 7, wherein placing the power amplifier in the high power back-off mode involves increasing a bias voltage or a bias current of the power amplifier.

9. The power amplifier controller of claim 7, wherein a difference between the first power back-off factor and the second power back-off factor is determined by a peak-to-average power ratio (PAPR) of the digital baseband signal.

10. The power amplifier controller of claim 7, wherein the receiving mechanism receives the digital baseband signal from a baseband digital signal processor (DSP) for the wireless transmitter.

11. The power amplifier controller of claim 7, wherein the power amplifier controller is part of a baseband digital signal processor (DSP) for the wireless transmitter.

12. The power amplifier controller of claim 7, wherein the digital baseband signal includes an inphase (I) component and a quadrature (Q) component, and wherein the power-determination mechanism is configured to determine the power level based on both the I component and the Q component.

13. A wireless transmitter, comprising:
a power amplifier;
a baseband digital signal processor (DSP);
a digital-to-analog converter (DAC);
a modulator; and
a power amplifier controller, wherein the power amplifier controller further comprises:
a receiving mechanism configured to receive a digital baseband signal;
a power-determination mechanism configured to determine a power level of the received digital baseband signal; and
a control-signal output mechanism configured to:
in response to the power level transitioning from being equal to or less than a predetermined threshold to being greater than the predetermined threshold, output a control signal to place the power amplifier in a high power back-off mode having a first power back-off factor; and
in response to the power level transitioning from being greater than the predetermined threshold to being equal to or less than the predetermined threshold, output a control signal to place the power amplifier in a normal mode having a second power back-off factor, wherein the second power back-off factor is less than the first power back-off factor.

14. The wireless transmitter of claim 13, wherein the DAC is configured to convert the digital baseband signal to an analog baseband signal, wherein the modulator is configured to modulate the analog baseband signal, and wherein the power amplifier is configured to amplify the modulated signal.

15. The wireless transmitter of claim 13, wherein placing the power amplifier in the high power back-off mode involves increasing a bias voltage or a bias current of the power amplifier.

16. The wireless transmitter of claim 13, wherein a difference between the first power back-off factor and the second power back-off factor is determined by a peak-to-average power ratio (PAPR) of the digital baseband signal.

17. The wireless transmitter of claim 13, wherein the modulator is a quadrature modulator.

18. The wireless transmitter of claim 13, wherein the power amplifier controller is part of the baseband DSP.

19. The wireless transmitter of claim 13, wherein the digital baseband signal includes an inphase (I) component and a quadrature (Q) component, and wherein the power-determination mechanism is configured to determine the power level based on both the I component and the Q component.

* * * * *